US009389520B2

(12) United States Patent
Chen (10) Patent No.: US 9,389,520 B2
(45) Date of Patent: Jul. 12, 2016

(54) SYSTEM AND METHOD FOR LITHOGRAPHY WITH LEVELING SENSOR

(75) Inventor: Li-Jui Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 724 days.

(21) Appl. No.: 13/365,845

(22) Filed: Feb. 3, 2012

(65) Prior Publication Data

US 2013/0201463 A1 Aug. 8, 2013

(51) Int. Cl.
*G03B 27/68* (2006.01)
*G03B 27/52* (2006.01)
*G03B 27/58* (2006.01)
*G03F 9/00* (2006.01)
*G03F 7/20* (2006.01)

(52) U.S. Cl.
CPC ............ *G03F 9/7034* (2013.01); *G03F 7/7085* (2013.01)

(58) Field of Classification Search
CPC . G03F 7/70283; G03F 7/703; G03F 7/70533; G03F 7/70591; G03F 7/707; G03F 7/70708; G03F 7/70725; G03F 7/70741; G03F 7/70775; G03F 7/70783; G03F 7/7085; G03F 7/20
USPC .................. 355/52, 53, 55, 67–77; 250/492.1, 250/492.2, 492.22, 548; 430/5, 8, 22, 30, 430/311, 312; 356/4.01, 4.08, 601, 609, 356/614, 624, 496, 498, 500, 508, 509, 510, 356/511, 516
See application file for complete search history.

(56) References Cited

U.S. PATENT DOCUMENTS

| | | | | | |
|---|---|---|---|---|---|
| 5,502,311 | A | * | 3/1996 | Imai et al. | 250/548 |
| 5,539,521 | A | * | 7/1996 | Otokake et al. | 356/601 |
| 5,573,877 | A | * | 11/1996 | Inoue | G03F 7/7035 |
| | | | | | 250/491.1 |
| 5,640,227 | A | * | 6/1997 | Kato et al. | 355/53 |
| 5,657,130 | A | * | 8/1997 | Shirasu et al. | 356/401 |
| 5,894,056 | A | * | 4/1999 | Kakizaki et al. | 430/5 |
| 6,195,154 | B1 | * | 2/2001 | Imai | G03F 9/7026 |
| | | | | | 355/53 |
| 6,262,792 | B1 | * | 7/2001 | Higashiki | 355/52 |
| 6,842,247 | B1 | * | 1/2005 | Wehrens et al. | 356/400 |
| 6,853,440 | B1 | * | 2/2005 | Van De Pasch et al. | 355/53 |
| 7,221,434 | B2 | * | 5/2007 | Shiode et al. | 355/75 |
| 7,924,405 | B2 | | 4/2011 | Yeh et al. | |
| 2002/0070355 | A1 | * | 6/2002 | Ota | 250/492.2 |
| 2003/0016338 | A1 | * | 1/2003 | Yasuda et al. | 355/55 |
| 2003/0090640 | A1 | * | 5/2003 | Fujisawa et al. | 355/53 |
| 2007/0260419 | A1 | * | 11/2007 | Hagiwara | G03F 7/70358 |
| | | | | | 702/150 |
| 2010/0129741 | A1 | * | 5/2010 | Bijvoet | 430/30 |

OTHER PUBLICATIONS

Burn J. Lin, "Sober View on Extreme Ultraviolet Lithography", J. Microlith., Microfab., Microsyst. 1537-1646/2006/$26.00 © 2006 SPIE, Jul.-Sep. 2006/vol. 5(3), 12 pages.

(Continued)

*Primary Examiner* — Christina Riddle
(74) *Attorney, Agent, or Firm* — Haynes and Boone, LLP (57) ABSTRACT

Disclosed is a lithography system. The lithography system includes a radiation source for providing radiation energy; a reticle stage configured to hold a reticle; an imaging lens module configured to direct the radiation energy onto a substrate to form an image of the reticle; and a leveling sensor configured to receive a leveling signal from an exposure field of the reticle secured on the reticle stage.

20 Claims, 7 Drawing Sheets

(56) References Cited

OTHER PUBLICATIONS

T.A. Brunner et al., "Focus and Dose Characterization of Immersion Photoclusters", Optical Microlithography XXII, Proc. of SPIE vol. 7274, 72740S © 2009 SPIE, CCC Code 0277-786X/09/$18, 8 pages.

Sudhar Raghunathan et al., "A Study of Reticle Non-Flatness Induced Image Placement Error Contributions in EUV Lithography", SPIE vol. 7636, 76360W © 2010 SPIE, CCC Code 0277-786X/10/$18, 10 pages.

Sudhar Raghunathan et al., "Experimental Determination of Image Placement Accuracy in Extreme Ultraviolet Lithography," J. Vac. Sci. Technol. B, vol. 27, 2905 (2009), 7 pages.

\* cited by examiner

SYSTEM AND METHOD FOR LITHOGRAPHY WITH LEVELING SENSOR

BACKGROUND

Semiconductor integrated circuit (IC) technology has experienced rapid progress including the continued minimization of feature sizes and the maximization of packing density. The minimization of feature size relies on improvement in photolithography and its ability to print smaller features or critical dimensions (CD). However, a reticle used in photolithography may experience a chucking or clamping issue that causes the reticle bended and deformed. Ultimately, the unevenness of the reticle will cause overlay error, which is a more serious issue for advanced technology nodes with small features. It is necessary to monitor reticle shape for its flatness but the existing lithography apparatus is not capable of effectively monitoring reticle shape, particularly the major pattern region of the reticle.

Therefore, an apparatus of a lithography patterning and a method utilizing the same are needed to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
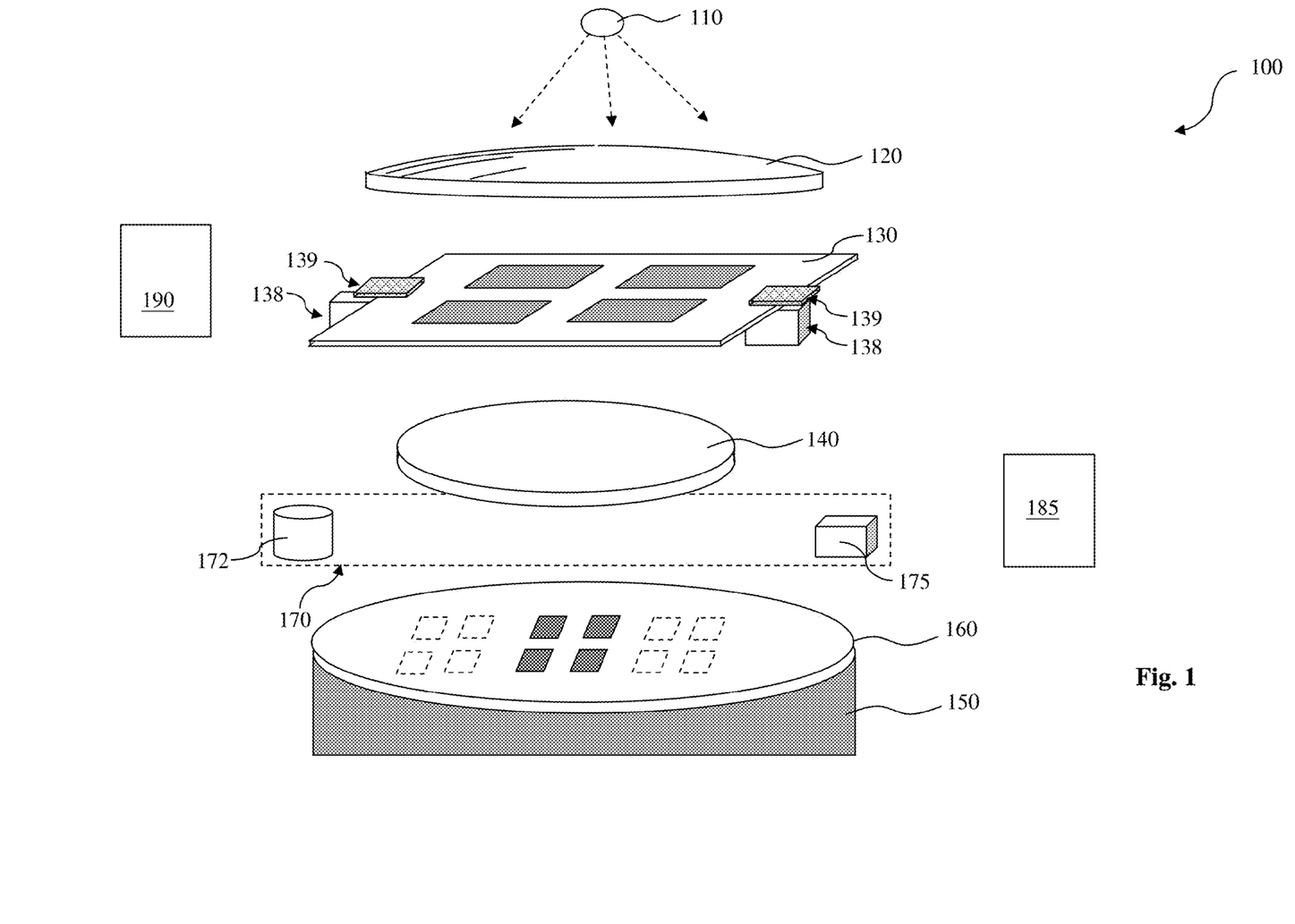
FIG. 1 is a schematic view of a lithography system with leveling sensor constructed according to aspects of the present disclosure in one or more embodiments.

FIG. 1 is a schematic view of a lithography system 100 capable of leveling scanning constructed according to various aspects of the present disclosure. With reference to FIG. 1 and other figures, the lithography system 100 and the method utilizing the same are collectively described. Referring to FIG. 1, in one embodiment, a lithography system 100 includes a radiation source (or source) 110 to provide radiation energy. The radiation source 110 may be any suitable light source. In various embodiments, the radiation source may include an optical source selected from the group consisting of ultraviolet (UV) source, deep UV (DUV) source, extreme UV (EUV) source, and X-ray source. For example, the source 110 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source has a wavelength of about 13.5 nm or less.

The lithography system 100 also includes an optical subsystem that receives the radiation energy from the radiation source 110, modulates the radiation energy by the image of a reticle and directs the radiation energy to a radiation sensitive layer coated on a substrate (such as a semiconductor wafer). In one embodiment, the optical subsystem is designed to have a refractive mechanism. In this situation, the optical subsystem includes various refractive components, such as lenses. In another embodiment where the radiation energy is EUV energy, the optical subsystem is designed to have a reflective mechanism. In this situation, the optical subsystem includes various reflective components, such as mirrors.

In an embodiment, the lithography system 100 includes an illumination module (e.g., a condenser) 120. The illumination module 120 may include a single lens or a lens module having multiple lenses and/or other lens components. For example, the illumination module 120 may include microlens arrays, shadow masks, and/or other structures designed to aid in directing radiation energy from the radiation source 110 onto a reticle (also referred to as photomask or mask) 130.

During a lithography patterning process, the reticle 130 is included in the lithography system 100. In one embodiment, the reticle 130 includes a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A light beam may be partially or completely blocked when directed on an absorption region. The absorption layer may be patterned to have one or more openings through which a light beam may travel without being absorbed by the absorption layer. The mask may incorporate other resolution enhancement techniques such as phase shift mask (PSM) and/or optical proximity correction (OPC).

In another embodiment where the radiation energy is EUV energy, the reticle is designed to have reflective mechanism. The reticle includes a substrate coated with a plurality of films to provide a reflective mechanism. For example, the reticle includes tens alternating layers of silicon and molybdenum deposited on a substrate to act as a Bragg reflector that maximizes the reflection of EUV light. The reticle may further include a capping layer, such as ruthenium, to prevent oxidation. The reticle may further include an anti-reflective layer, such as a tantalum boron nitride film.

The reticle 130 is secured on a reticle stage 138 of the lithography system 100 by a clamping mechanism (reticle clamp or clamping feature) 139, such as vacuum clamping or e-chuck clamping. In the present embodiment, the clamping mechanism 135 is a portion of the reticle stage 138. As pointed out, the reticle clamping will cause the deformation of the reticle, leading to the overlay errors and/or out of focus. The reticle stage 138 is designed and configured to be operable for translational and rotational motions according to the present embodiment. In another embodiment, the reticle stage 139 is further designed operable to tilt such that the reticle is tilted (not parallel) with a wafer to be patterned in the lithography system 100.

Figure 2:
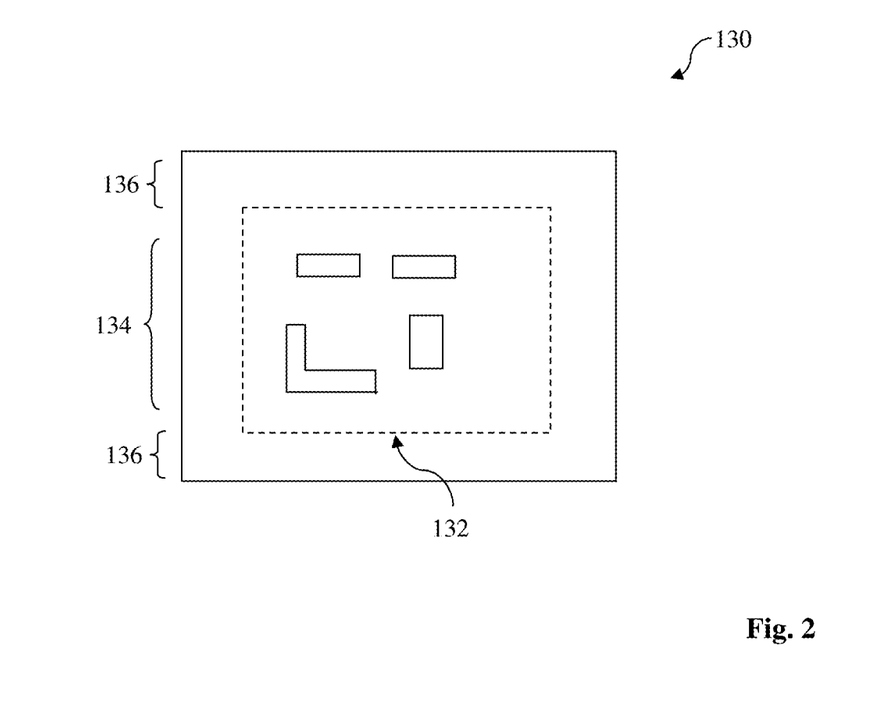
FIG. 2 is a top view of a reticle used in the lithography system of FIG. 1 constructed according to aspects of the present disclosure in one or more embodiments.

One exemplary reticle 130 is illustrated in FIG. 2 as a top view for further description. The reticle 130 includes an exposure field 132 to be exposed by the lithography system 100. The reticle 130 further includes a circuit pattern 134, defined in the exposure field 132 and to be imaged to a resist layer for patterning. The reticle 130 also includes a frame region 136 surrounding the exposure field 132. The frame region 136 may include some non-circuit patterns, such as marks, mask identification number, barcode, and/or other non-circuit features. The lithography system 100 in the present disclosure provides a capability of monitoring the reticle flatness by directly measuring or scanning all locations of the exposure field (intra-field) 132.

The lithography system 100 includes an projection module 140. The projection module 140 may have a single lens element or a plurality of lens elements configured to provide proper illumination to the resist layer on a wafer. Each lens element may include a transparent substrate and may further include a plurality of coating layers. The transparent substrate may be a conventional projection lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of light used in the lithography process to minimize absorption and scattering. The illumination module 120 and the projection module 140 are collectively referred to as an imaging module (or imaging lens). The imaging lens may further include additional components such as an entrance pupil and an exit pupil to form an image of the reticle 130 on a substrate to be patterned. In another embodiment, the projection module 140 may include various mirror components to provide a reflective mechanism.

The lithography system 100 may further include a substrate stage 150 that is capable of securing and moving a substrate 160 in translational and rotational modes such that the substrate may be aligned with the mask 130.

In the present example, the substrate 160 is provided in the lithography system 100 for receiving a lithography process. In one embodiment, the substrate 160 includes a semiconductor wafer having an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or a combination thereof. In furtherance of the present embodiment, a radiation-sensitive layer, such as photoresist (or resist), is coated on the substrate 160 and receives the radiation energy from the radiation source 110 during the lithography process.

The lithography system 100 may be designed differently according to different characteristics of the radiation source and other factors. In one example, the radiation source 110 includes an EUV source having a wavelength around 13.5 nm. In this case, the imaging module is different due to the characteristics of the EUV, such as absorption. For example, the imaging module associated with the EUV source includes reflective optical components and reflective reticle, as noted above.

In another example, the system is designed to hold a liquid in the optical path between the projection lens 140 and the substrate 160 to enhance the resolution. Thus configured lithography system is also referred to as an immersion lithography system.

The lithography system 100 includes a leveling module 170 integrated with other modules and parts of the system 100. The leveling module 170 is designed and configured to be operable for monitoring the flatness (shape or leveling) of the reticle 130 secured in the lithography system 100. Particularly, the leveling module 170 includes a leveling signal source (leveling source or light source) 172 to provide a leveling signal (such as a light beam) to scan the reticle 130. In one embodiment, the leveling signal source 172 includes a laser source with a proper wavelength to effectively monitor local geometry of the reticle.

The leveling module 170 also includes a leveling sensor (or sensor) 175 designed to receive the leveling signal directed from the reticle 130. For example, the leveling signal is generated by the leveling signal source 172, is reflected from the reticle 130, and is directed to the leveling sensor 175. The leveling sensor 175 is designed to be sensible to the leveling signal generated by the leveling source 172. In one embodiment, the leveling sensor 175 includes one sensing unit, such as a photodiode, to receive the sensing signal. In an alternative embodiment, the sensor 175 includes an array of sensing units (or sensor array) configured to receive the leveling signal for its intensity and spatial distribution. In the present embodiment, the leveling scanning to the reticle 130 is implemented by the leveling module 170 after the reticle 130 is clamped but before the lithography exposure.

The leveling signal source 172 and the leveling sensor 175 are configured to provide the leveling signal to the reticle 130 by the leveling source 172 and receive the leveling signal from the reticle 130 by the leveling sensor 175, respectively. Furthermore, the leveling source 172 and the leveling sensor 175 are configured to be operable to scan the reticle 130 for its flatness data (leveling data) over the reticle surface including the exposure field. For example, a mechanism is provided to move the reticle 130 relative to the leveling source 172 and the leveling sensor 175.

The leveling module 170 may utilize any proper mechanism to monitor reticle flatness. In one embodiment, the leveling signal is light. The leveling signal from the leveling source 172 is split into two coherent beams. One beam is directed to the reticle 130 and is then directed to the sensor 175. Another beam is used as a reference and is directly directed to the sensor 175. The two beams are recombined at the leveling sensor and are interfered constructively or destructively, depending on the optical path difference of the two beams. Accordingly, the light intensity received by the sensor 175 provides the information of the distance of the reticle at the shined spot, similar to a Michelson interferometer. The geometry data or flatness of the reticle is extracted from the leveling signal. In one embodiment, the leveling module 170 includes other components, such as a beam splitter to split the light into two beams.

The leveling signal from the leveling source 172 may be transmitted through the reticle 130 or reflected from the reticle 130, depending on various factors including the lithography system 100 and the configuration of the leveling module 170.

Figure 3:
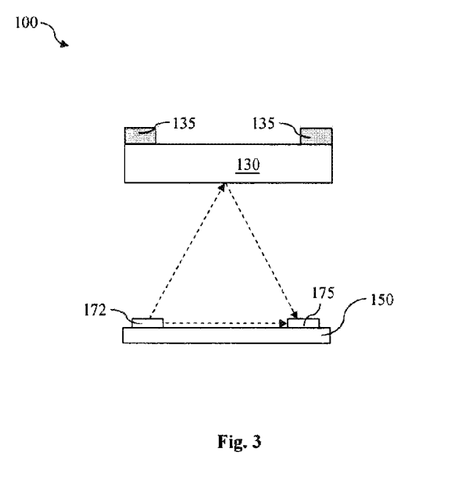
FIGS. 3 and 4 are fragmental sectional view of the lithography system of FIG. 1 constructed according to aspects of the present disclosure in various embodiments.

In one embodiment, a reflective mechanism is implemented as illustrated in FIG. 3. FIG. 3 is a fragmental sectional view of the lithography system 100 constructed according to one embodiment. The leveling source 172 and the leveling sensor 175 are secured on the substrate stage 150 and are configured in a way such that the light generated by the leveling source 172 is directed to the reticle 130 and is reflected from the reticle to the leveling sensor 175. In furtherance of the embodiment, the substrate stage 150 is operable to move relative to the reticle 130. Since the leveling source 172 and leveling sensor 175 are secured on the substrate stage 150, both are moved along with the substrate stage 150. Thus, by moving the substrate stage 150 in a scanning mode, the leveling signal from the leveling source 172 is scanned over the reticle 130 and is properly received by the leveling senor 175 during the scanning.

Figure 4:
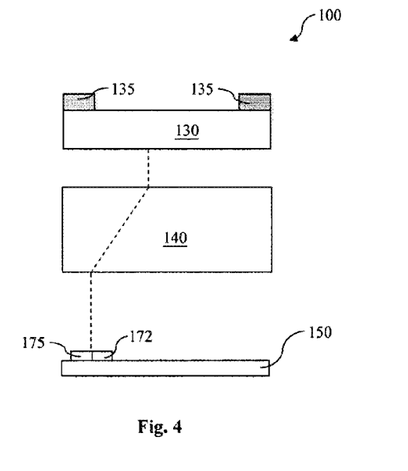

In another embodiment, a transmission mechanism is implemented as illustrated in FIG. 4. FIG. 4 is a fragmental sectional view of the lithography system 100 constructed according to another embodiment. The leveling source 172 and the leveling sensor 175 are secured on the substrate stage 150. The leveling source 172 and the leveling sensor 175 are configured in a way such that the leveling signal (or light) generated by the leveling source 172 is reflected from the reticle 130 but is transmitted through the projection module 140. Particularly, the leveling signal is transmitted through the projection lens 140, is reflected from the reticle 130, is directed back through the projection lens 140 and then reaches the sensor 175.

The clamped reticle 130 is scanned by the leveling module 170 of the lithography system 100 in either reflective mode (as illustrated in FIG. 3) or a refractive (transmission) mode (as illustrated in FIG. 4). The reticle 130 may be located at different locations during the leveling scanning according to various mechanism of the lithography system. The reticle clamping may choose a proper clamping mechanism accordingly. It is further explained with reference to FIG. 5 as a block diagram 210. The reticle clamping at block 212 is chosen according to the corresponding lithography mechanism. In one embodiment, the clamped reticle is positioned inside the exposure area (in the reticle exposure position) during the leveling scanning shown at block 214. Accordingly, the lithography system 100 has a mechanism of reflective exposure shown at block 216. In one example, the lithography system 100 is an extreme ultra-violet (EUV) lithography system wherein the optical lens and the reticle are designed as reflective components. In furtherance of the embodiment, the reticle is clamped by e-chuck clamp shown at block 218.

Figure 5:
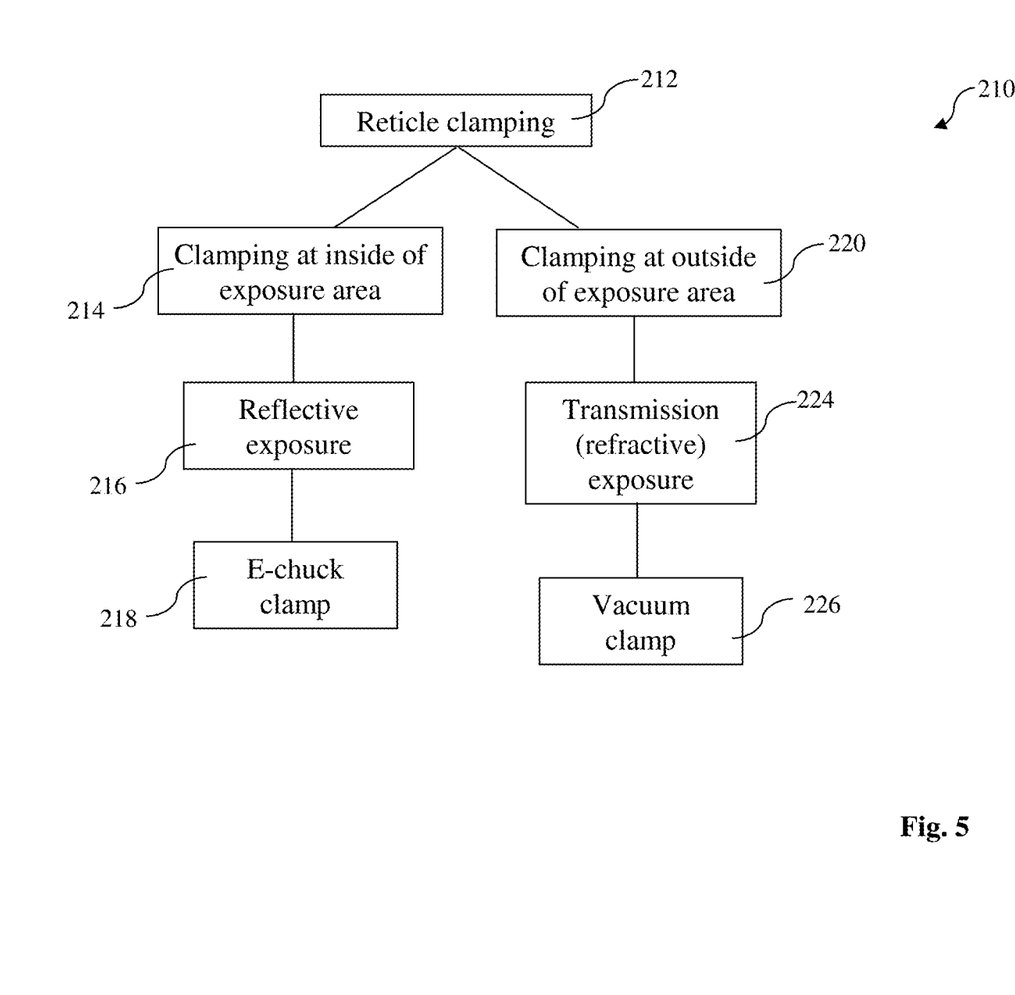
FIG. 5 is a block diagram illustrating various embodiments of the lithography system of FIG. 1 constructed according to aspects of the present disclosure.

In another embodiment, the clamped reticle is located outside of the exposure area (or the reticle transfer path) during the scanning shown at block 220. Accordingly, the lithography system 100 has a mechanism of transmission (refractive exposure) shown at block 224. In one example, the lithography system 100 is an immersion lithography system wherein the optical lens and the reticle are designed as transmission (refractive) components. In furtherance of the embodiment, the reticle is clamped by vacuum clamp shown at block 226.

In yet another embodiment, the leveling module 170 may include other components, such as one or more lens configured to redistribute the leveling signal from the leveling source 172 and other lens configured to focus the leveling signal to the sensor 175 for better sensing of the leveling signal.

Back to FIG. 1, the lithography system 100 includes a leveling analysis module 185 coupled with the leveling module 172 and designed to extract the leveling data of the clamped reticle 130 and may further extract the overlay error data. The leveling analysis module 185 may include a data saving media, such as hard disk or non-volatile semiconductor memory device for saving the leveling data and/or various analysis models. The leveling analysis module 185 may include a data processing unit, such as central processing unit (CPU) for data processing. In one embodiment, the leveling analysis module 185 includes a computer coupled with the lithography system 100. In another embodiment, the leveling analysis module 185 is distributed in an intranet or a portion of the Internet coupled with a semiconductor manufacturer. The leveling analysis module 185 is capable of collecting the leveling data, processing the leveling data, and generating one or more control parameters for controlling the reticle in order to compensate the leveling-induced variations.

Figure 6:
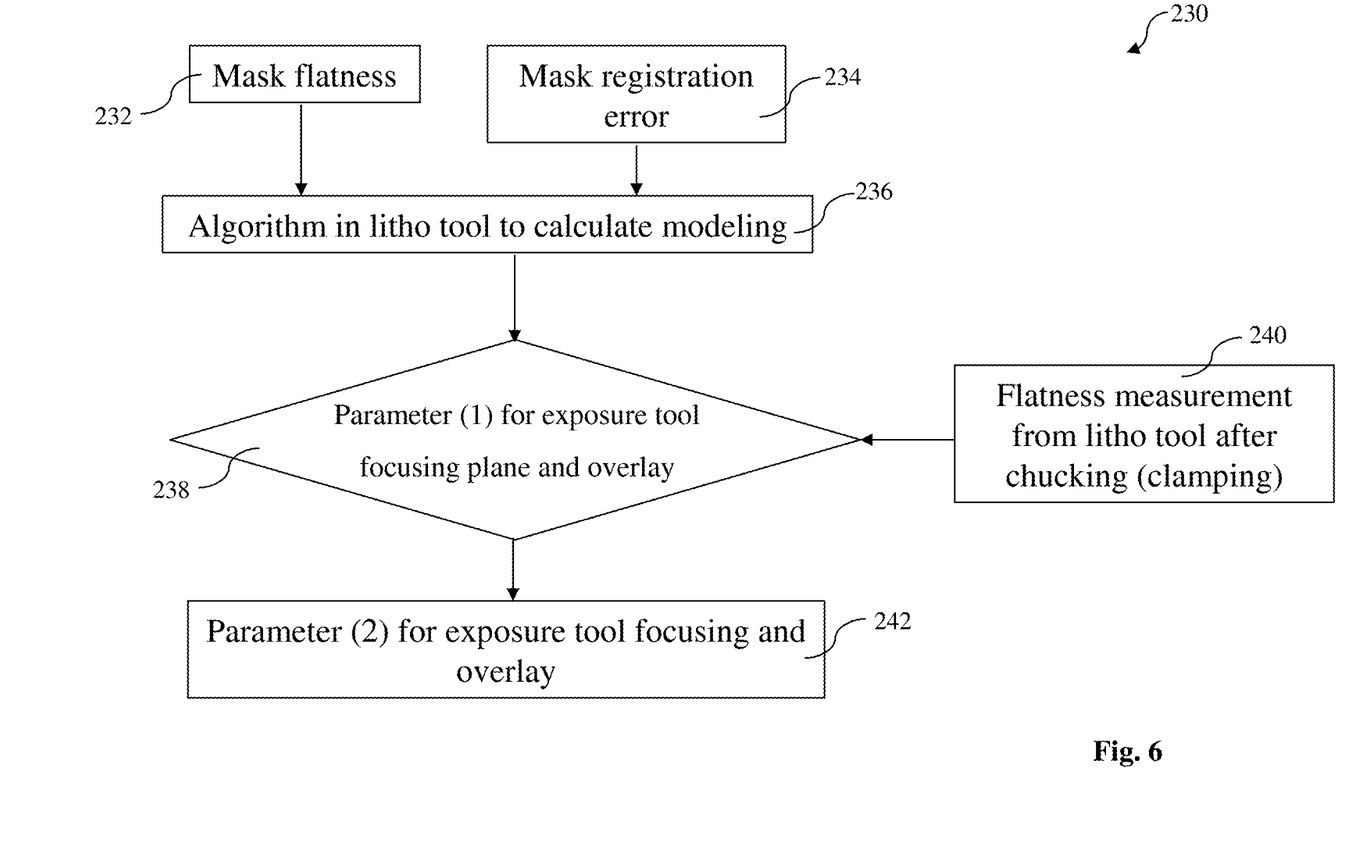
FIG. 6 is a block diagram illustrating a processing flow of a leveling analysis module in the lithography system of FIG. 1 constructed according to aspects of the present disclosure in one embodiment.

FIG. 6 is a block diagram 230 illustrating a processing flow of the leveling analysis module constructed according to aspects of the present disclosure in one embodiment. The mask flatness data (at block 232) and the mask registration error (or overlay error) data (at block 234) are measured and are provided to a leveling model (at block 236) that is able to calculate one or more control parameters to control the reticle moving in a way to compensate the overlay error caused by the uneven reticle. The mask registration error are measured by collecting the mask image and comparing with a mask grid as a reference for registration error. The mask flatness data are measured by the leveling module 170. Both are in-situ measured in the lithography system 100 after the reticle 130 is clamped and before the exposure process is applied to the reticle 130.

Then, based on the mask flatness data and the mask registration error data, the leveling model (block 236) generates one or more control parameters (block 238). In one example, the control parameters includes a focus length of the imaging module during the exposure process. The focus length may be a variant over the location of the reticle due to unevenness of the reticle. Those control parameters are provided in controlling motion of the reticle during the exposure process in order to compensate the overlay error caused by the uneven reticle.

The in-situ measured mask flatness (block 240) may be further provided to the leveling model to generate other control parameters (block 242), such as reticle tilt angle during the exposure process. Those parameters are also variants over the location of the reticle. Those control parameters are provided to control motion of the reticle during the exposure process to compensate the overlay error caused by the unevenness of the reticle.

Back to FIG. 1, the lithography system 100 further includes a control module 190 coupled with the reticle stage 138 and designed to control the reticle stage for various motions, such as vertical motion and tilting to compensation the overlay error. The control module 190 is further coupled with the leveling analysis module 185 to receive the control parameters therefrom so that the control module 190 is able to control the reticle stage 138 according to various control parameters during the exposure process. For example, during the exposure process, the reticle stage 138 is controlled to move vertically to tune the focus length according to the unevenness of the reticle at an area being scanned through. Thus, the focus length is dynamically tuned during the exposure process. Similarly, during the exposure process, the reticle stage 138 is controlled to tilt to reduce the overlay error according to the unevenness of the reticle at an area being scanned through. Thus, the tilt angle is dynamically tuned during the exposure process for reduced overlay error.

Figure 7:
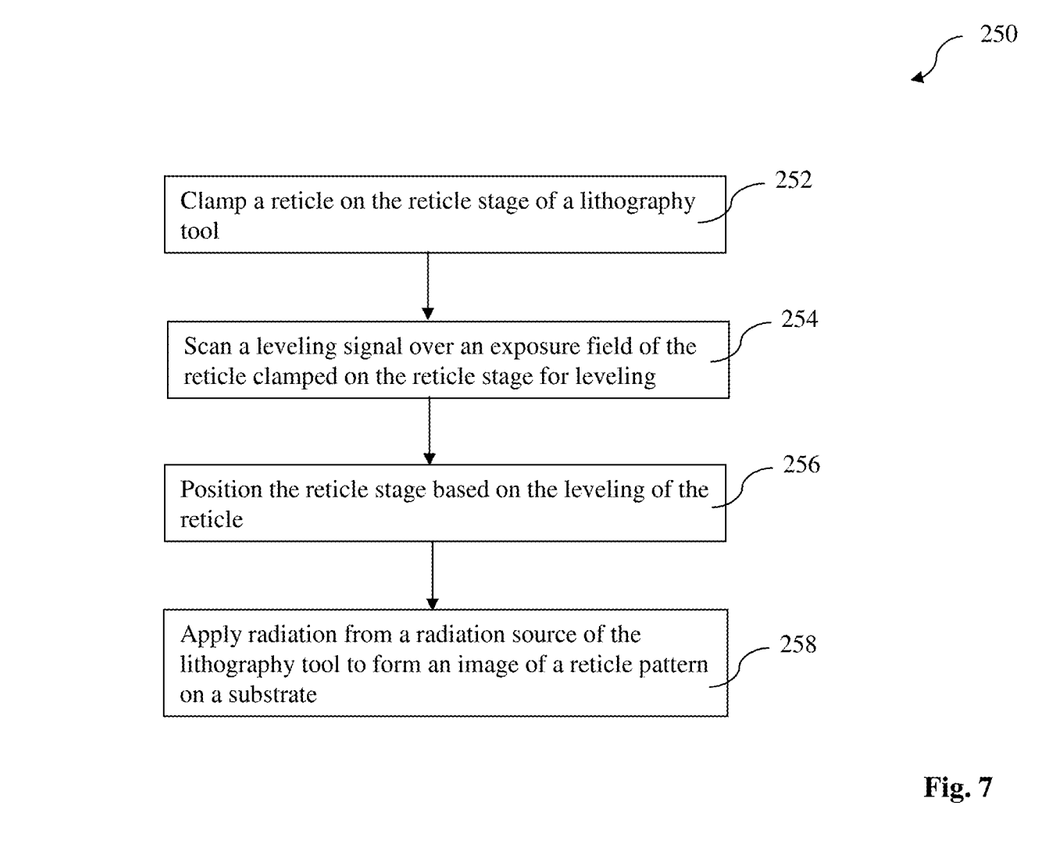
FIG. 7 is a flowchart of a method to implement the lithography system of FIG. 1 constructed according to aspects of the present disclosure in one embodiment.

FIG. 7 is a flowchart 250 illustrating a method 250 of an exposure process by the lithography system 100 according to one or more embodiments. The method 250 is described with reference to FIGS. 1 and 7. The method 250 begins at step 252 by clamping a reticle on the reticle stage of the lithography system 100.

At step 254, the reticle is scanned for the leveling signal by the leveling module 170 of the lithography system 100. The scanning is performed over the exposure field of the reticle.

The method 250 continues to step 256 by positioning the reticle stage according to the leveling (unevenness or flatness) of the reticle. The positioning is controlled by the control module 190.

The method 250 also includes a step 258 by performing an exposure process to the reticle. During the exposure process, the radiation energy (such as DUV beam or EUV beam) from the radiation source 110 is directed to the reticle, forming an image of the reticle pattern on a substrate (e.g., a semiconductor wafer) secured on a substrate stage 150. Particularly, the substrate is coated with a resist layer sensitive to the radiation energy.

In one embodiment, the step 256 and step 258 are simultaneously implemented. While the substrate is exposed with the radiation energy, the reticle is dynamically positioned (such as vertical motion and/or tilting) to reduce the overlay error. The positioning is controlled by the control module 190. The control module 190 dynamically controls the reticle stage 138 for vertical motion and tilting according to the control parameters provided by the leveling analysis module 185.

FIGS. 8 through 13 illustrate various positioning or dynamical tuning actions of the reticle stage 138 according to various embodiments. The positioning action 256 is implemented by the control module 190. In the present example, the scanning slit is aligned at X direction and the scanning direction is along Y direction, the vertical direction is Z direction. X, Y and Z direction are perpendicular to each other. For reference, a virtual reticle 260 is illustrated and that is in a desired position, not tilted and without distortion. The reticle 262 in each situation is substantially in a X-Y plane but can be off from the reference one 260, such as out of the focus (having a shift on the Z axis), tilting, and/bending. The reticle tilting may be around the X axis and/or the Y axis. Accordingly, the rotation angles around X axis and Y axis during a tuning action are referred to as Rx and Ry, respectively.

Figure 8:
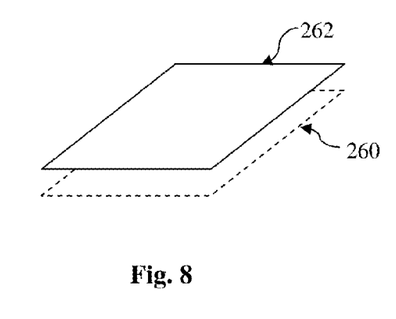
FIGS. 8 through 13 illustrate various operations by a control module in the lithography system of FIG. 1 constructed according to aspects of the present disclosure in one embodiment.

In FIG. 8, the focus has an offset (dZ), the positioning action 256 includes moving (shifting) the reticle stage along the Z direction to cancel the focus offset. The exposure process 258 is applied thereafter. Alternatively, if the offset is only associated with a location of the reticle, this particular positioning action is applied to the reticle while the radiation energy is scanned to that location of the reticle.

Figure 9:
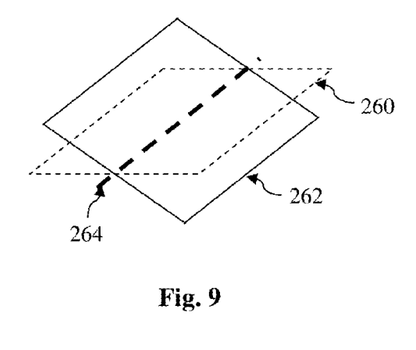

In FIG. 9, the reticle and reticle image (or mask image) is tilted over X direction (dZ/dX), the positioning action 256 includes tilting the reticle stage around Y axis to cancel the tilting effect.

Figure 10:
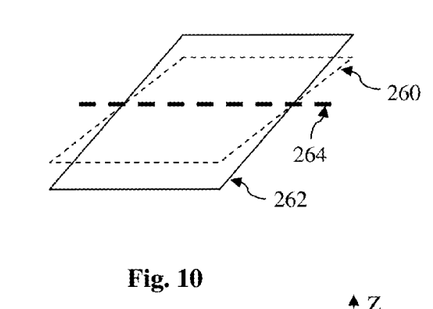

In FIG. 10, the mask image is tilted over Y direction (dZ/dY), the positioning action 256 includes tilting the reticle stage around X axis to cancel the tilting effect.

Figure 11:
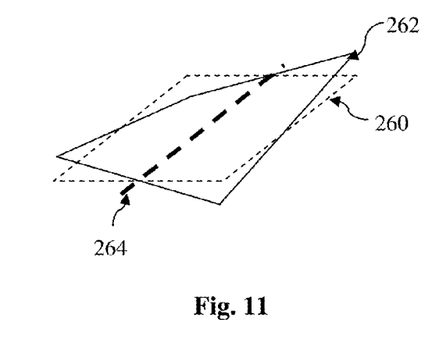

In FIG. 11, the mask image is tilted over both X and Y directions (dZ/dXdY), the positioning action 256 includes tilting the reticle stage around an axis different from the X axis and Y axis to cancel the tilting effect.

Figure 12:
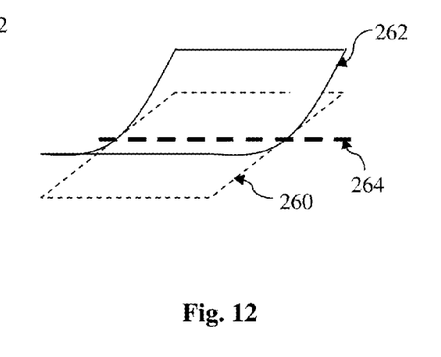

In FIG. 12, the reticle is bended such that the mask image has a quadratic wedge over Y direction (dZ/dY2), the positioning action 256 includes continuously changing the tilt angle of the reticle stage around the X axis to cancel the quadratic wedge effect.

Figure 13:
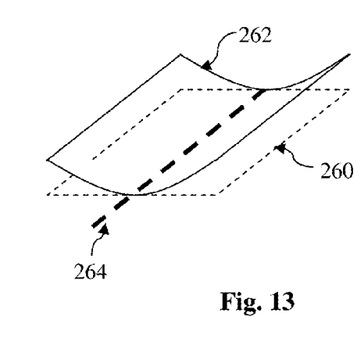

In FIG. 13, the reticle is bended such that the mask image has a quadratic wedge over X direction (dZ/dX2), the positioning action 256 includes continuously changing the tilt angle of the reticle stage around the Y axis to cancel the quadratic wedge effect. Other situations may involves combinations of focus offset, tilting and bending. Accordingly, the positioning action 256 includes combinations of vertical shifting and various acts of tilting. In addition to the repositioning action during an exposure process, the reticle shape correction may be further improved by other methodology and technology. For example, the optical components (such as lens) of the lithography system 100 may be designed differently to compensate the distortion of the reticle image.

The lithography system 100 may also incorporate other techniques and components. For example, the lithography system may also include components and mechanism to implement an immersion lithography process. In another example, if the radiation energy is EUV beam, the optical lens and the reticles are reflective components. In furtherance of this example, the substrate and other components are included in a vacuum chamber.

Although various embodiments of the lithography system 100 and the method utilizing the same are provided according to various aspects of the present disclosure, various alternatives and modifications may be used without departure of the spirit of the present disclosure. By utilizing the lithography system 100 and implementing various disclosed methods, one or more advantages may present in different embodiments. For example, the measured leveling data can be used to improve the intra field focus control, especially for immersion lithography and EUV lithography. In another example, the disclosed leveling module is able to scan the exposure field of the reticle and directly acquire the leveling data of the reticle within the exposure field.

Thus, the present disclosure provide a lithography system. The system includes a radiation source for providing radiation energy; a reticle stage configured to hold a reticle; an imaging lens module configured to direct the radiation energy onto a substrate to form an image of the reticle; and a leveling sensor configured to receive a leveling signal from an exposure field of the reticle secured on the reticle stage.

In one embodiment of the lithography system, the leveling sensor includes a plurality of sensing units configured in an array. In another embodiment, the lithography system further includes a substrate stage configured to hold the substrate and operable to move relative to the reticle stage, wherein the leveling sensor is integrated with the substrate stage.

In yet another embodiment, the lithography system further includes a leveling signal source configured to direct and scan a leveling signal to the exposure field of the reticle secured on the reticle stage. In yet another embodiment the leveling signal source is a laser source.

In yet another embodiment, the leveling signal source is secured on the substrate stage. In furtherance of the embodiment, the imaging lens module includes a projection lens module configured between the reticle stage and the substrate stage.

In yet another embodiment, the leveling signal source and the leveling sensor are configured such that the leveling signal from the leveling signal source is directed to the leveling sensor through the projection lens module.

In an alternative embodiment, the leveling signal source and the leveling sensor are configured such that the leveling signal is directly reflected from the reticle to the leveling sensor.

In yet another embodiment, the reticle is secured on the reticle stage by an e-chuck clamp. In an alternative embodiment, the reticle is secured on the reticle stage by a vacuum clamp.

In yet another embodiment, the lithography system further includes a leveling analysis module to analyze the leveling signal for reticle leveling; and a control module coupled to the leveling analysis module and configured to control the reticle stage for at least one of tilting and focusing according to a feedback from the leveling analysis module.

The present disclosure also provides another embodiment of a lithography system. The lithography system includes a radiation source for providing radiation energy; a reticle stage configured to hold a reticle having a circuit pattern within an exposure field; a substrate stage configured to secure a substrate; an optical module configured to direct the radiation energy onto the substrate to form an image of the circuit pattern; a leveling signal source to provide a leveling signal to the reticle; and leveling sensor to receive the leveling signal from the reticle, wherein the leveling signal source and the leveling sensor are configured to scan the leveling signal over the exposure field of the reticle.

In one embodiment, the leveling signal source is a laser source and the leveling signal is a coherent light.

In another embodiment, the lithography system further includes a leveling optical module to split the coherent light from the leveling signal source, generating a first beam and a second beam; and a leveling analysis module to extract leveling data of the reticle. The leveling optical module is operable to direct the first beam to the leveling sensor, and direct the second beam to reticle and then to the sensor such that an interference pattern is formed between the first and second beams. The leveling analysis module is operable to extract the leveling data of the reticle from the interference pattern.

In yet another embodiment, the lithography system further includes a control module operable to control the reticle stage for tilting and focusing according to the leveling data from the leveling analysis module.

In yet another embodiment, the control module is operable to dynamically tilt the reticle stage during an exposure process.

The present disclosure also provides a method for a lithography system. The method includes securing a reticle on a reticle stage of the lithography system, wherein the reticle includes a circuit pattern within an exposure field; scanning the reticle using a leveling signal over the exposure field of the reticle for reticle leveling while the reticle is secured on the reticle stage; and thereafter, applying radiation energy from a radiation source of the lithography system to form an image of the circuit pattern of the reticle within the exposure field on a substrate.

In one embodiment, the method further includes moving the reticle stage to tune at least one of tilting angle and focus length based on the reticle leveling after the scanning of the reticle.

In yet another embodiment, the applying radiation energy from a radiation source includes scanning the radiation energy over the exposure field of the reticle; and the moving the reticle stage includes moving the reticle stage dynamically during the scanning radiation energy over the exposure field of the reticle.

In yet another embodiment, the method further includes receiving the leveling signal directed from the reticle by a leveling sensor.

In yet another embodiment, the scanning of the reticle using a leveling signal over the exposure field of the reticle is implemented while the reticle stage is positioned on one of reticle transfer path and reticle exposure location.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A lithography system, comprising:
a radiation source for providing radiation energy;
a reticle stage configured to hold a reticle;
a substrate stage configured to hold a substrate and operable to move relative to the reticle stage;
an imaging lens module configured to direct the radiation energy onto the substrate to form an image of the reticle;
a leveling signal source configured to direct and scan a leveling signal to an exposure field of the reticle secured on the stage, wherein the leveling signal source is secured to the substrate stage such that the leveling signal source moves with the substrate stage relative to the reticle stage;
a leveling sensor configured to receive the leveling signal from the exposure field of the reticle secured on the reticle stage, wherein the leveling sensor is secured to the substrate stage such that the leveling sensor moves with the substrate stage relative to the reticle stage;
a leveling analysis module operable to receive the leveling signal from the leveling sensor, calculate at least one of a reticle flatness measurement and a reticle overlay error measurement for the reticle based on the received leveling signal, generate a first control parameter associated with a focus length based on at least one of the reticle flatness measurement and the reticle overlay error measurement, and generate a second control parameter associated with a tilt angle of the reticle based on at least one of the reticle flatness measurement and the reticle overlay error measurement;
a control module operable to receive the first and second control parameters from the leveling analysis module and move the reticle stage based on the first control parameter and tilt the reticle stage based on the second control parameter; and
wherein the leveling signal source and the leveling sensor are secured to an upper surface of the substrate stage.

2. The lithography system of claim 1, wherein the leveling sensor includes a plurality of sensing units configured in an array.

3. The lithography system of claim 1, wherein the leveling signal source is a laser source.

4. The lithography system of claim 1, wherein the imaging lens module includes a projection lens module configured between the reticle stage and the substrate stage.

5. The lithography system of claim 4, wherein the leveling signal source and the leveling sensor are configured such that the leveling signal from the leveling signal source is directed to the leveling sensor through the projection lens module.

6. The lithography system of claim 1, wherein the leveling signal source and the leveling sensor are configured such that the leveling signal is directly reflected from the reticle to the leveling sensor.

7. The lithography system of claim 1, wherein the reticle is secured on the reticle stage by an e-chuck clamp.

8. The lithography system of claim 1, wherein the reticle is secured on the reticle stage by a vacuum clamp.

9. The lithography system of claim 1, wherein the control module is operable to move the reticle stage based on the first control parameter along a first axis and tilt the reticle stage based on the second control parameter along a second axis that is different than the first axis.

10. A lithography system, comprising:
a radiation source for providing radiation energy;
a reticle stage configured to hold a reticle having a circuit pattern within an exposure field;
a substrate stage configured to secure a substrate to an upper surface of the substrate stage;
an optical module configured to direct the radiation energy onto the substrate to form an image of the circuit pattern;
a leveling signal source to provide a first leveling signal that includes a first beam and a second beam, the leveling signal source configured to direct the first beam to the exposure field of the reticle and configured to direct the second beam directly at a leveling sensor;
the leveling sensor configured to receive the first beam reflected from the reticle and the second beam directly from the leveling signal source, wherein the leveling sensor recombines the first and second beams to form a second leveling signal, wherein the leveling signal source and the leveling sensor are secured to the upper surface of the substrate stage; and
a leveling analysis module operable to analyze the second leveling signal for reticle leveling; and
a control module coupled to the leveling analysis module and configured to control the reticle stage for tilting and focusing according to feedback from the leveling analysis module.

11. The lithography system of claim 10, wherein the leveling signal source is a laser source and the leveling signal is a coherent light.

12. The lithography system of claim 11, further comprising a leveling optical module to split the coherent light from the leveling signal source, generating the first beam and the second beam; and
wherein the leveling optical module is operable to direct the first beam to the leveling sensor, and direct the second beam to the reticle and then to the sensor such that an interference pattern is formed between the first and second beams, and
wherein the leveling analysis module is operable to extract the leveling data of the reticle from the interference pattern.

13. The lithography system of claim 10, wherein the leveling analysis module is operable to generate a first control parameter associated with a focus length and a second control parameter associated with a tilt angle of the reticle based on the second leveling signal; and
wherein the control module is operable to move the reticle stage based on the first control parameter and tilt the reticle stage based on the second control parameter.

14. A method for a lithography system, comprising:
securing a reticle on a reticle stage of the lithography system, wherein the reticle includes a circuit pattern within an exposure field;
after securing the reticle on the reticle stage, scanning the reticle using a leveling signal over the exposure field of the reticle for reticle leveling while the reticle is secured on the reticle stage, wherein scanning the reticle using the leveling signal includes moving a leveling signal source producing the leveling signal while scanning the reticle, wherein the leveling signal source is operable to move in a first direction and is also operable to move in a second direction perpendicular to the first direction;
after scanning the reticle, generating a first control parameter associated with a focus length and a second control parameter associated with a tilt angle of the reticle based on the leveling signal;
moving the reticle stage based on the first control parameter and tilting the reticle stage based on the second control parameter; and
after moving the reticle stage based on the first control parameter and tilting the reticle stage based on the second control parameter, applying radiation energy from a radiation source of the lithography system to form an image of the circuit pattern of the reticle within the exposure field on a substrate.

15. The method of claim 14, wherein the applying radiation energy from a radiation source includes scanning the radiation energy over the exposure field of the reticle; and
wherein the moving the reticle stage based on the first control parameter includes moving the reticle stage dynamically during the scanning radiation energy over the exposure field of the reticle.

16. The method of claim 14, further comprising receiving the leveling signal directed from the reticle by a leveling sensor.

17. The method of claim 14, wherein the scanning of the reticle using a leveling signal over the exposure field of the reticle is implemented while the reticle stage is positioned on one of a reticle transfer path and a reticle exposure location.

18. The method of claim 14, wherein moving the reticle stage based on the first control parameter includes moving the reticle stage along an axis, and
wherein tilting the reticle stage based on the second control parameter includes tilting the reticle stage around the axis.

19. The method of claim 14, wherein moving the reticle stage based on the first control parameter includes moving the reticle stage along a first axis, and
wherein tilting the reticle stage based on the second control parameter includes tilting the reticle stage around a second axis that is different than the first axis.

20. The method of claim 14, wherein scanning the reticle using the leveling signal includes moving a leveling sensor while the level sensor receives the leveling signal from the exposure field of the reticle.

* * * * *